United States Patent [19] [11] 3,837,887
Akamatsu et al. [45] Sept. 24, 1974

[54] PROCESS FOR THE PREPARATION OF PRINTING PLATE OF PHOTOSENSITIVE RESIN

[75] Inventors: Kiyoshi Akamatsu, Tokyo; Masayasu Maruta, Ohi; Yasushi Yonekura, Tokyo, all of Japan

[73] Assignee: Asahi Kasei Kogyo Kabushiki Kaisha, Osaka, Japan

[22] Filed: June 14, 1972

[21] Appl. No.: 262,827

Related U.S. Application Data

[62] Division of Ser. No. 45,745, June 12, 1970, Pat. No. 3,687,785.

[30] Foreign Application Priority Data

June 16, 1969 Japan .............................. 44-46817

[52] U.S. Cl. .................................... 117/34, 96/35.1

[51] Int. Cl. ........ C03c 1/74, C03c 3/26, G03c 1/00

[58] Field of Search ......................... 117/34; 96/35.1

[56] References Cited

UNITED STATES PATENTS 3,287,152 1/1966 Alles et al. ............................ 117/34

*Primary Examiner*—David Klein
*Attorney, Agent, or Firm*—Sughrue, Rothwell, Mion, Zinn & Macpeak

[57] ABSTRACT

An apparatus for the preparation of a printing plate comprising a layer of photo-sensitive liquid resin, wherein the improvement comprises an application means for laminating an anti-wrinkle plastic sheet on the resin surface upon being doctored and at the same speed with that of the doctor.

1 Claim, 6 Drawing Figures

PROCESS FOR THE PREPARATION OF PRINTING PLATE OF PHOTOSENSITIVE RESIN

This is a division of application Ser. No. 45,745, filed June 12, 1970, and now U.S. Pat. No. 3,687,785, granted Aug. 29, 1972.

This invention relates to a process for the manufacture of the printing plate with use of photosensitive resin. It relates further to an apparatus adapted to carry out said process.

The above-kind of new and improved process and apparatuses for carrying out the same have attracted grave concerns among those skilled in the art. Especially, the newspaper industry and the like are recently and rapidly adopting this improved technique on account of its higher speed of manufacturing the printing plate at an economical cost.

It is a prior and generally employed technique in this improved art to use a solid photosensitive resin prefabricated as a photosensitive plaque with metal backing. This plaque is exposed to actinic light through an image-bearing transparency such as a photographic negative film to harden the exposed portions corresponding to the image areas, and then the non-exposed portions are washed out by applying a proper solvent for the formation of the relief.

Considerable troubles may be encountered in use of these prefabricated photosensitive plaques by the unavoidable injury or distortions, uneveness in the thickness of a number of such plaques when observed as a whole, thereby the desired preciseness of the printing relief being injured correspondingly.

Another drawback as met in the use of the prefabricated photosensitive plaque resides in the consumption of a relatively long time period for the preparation of the printing plate.

Another prior proposed technique is to use a liquid photosensitive resin for the same purpose, but it is highly difficult to prepare a smooth and precisely plane surface thereon ready for forming the printing relief.

It is therefore the main object of this invention to provide a process and an apparatus for the preparation of the printing plate with use of a liquid photosensitive resin, while obviating the aforementioned various conventional drawbacks.

These and further objects, features and advantages of the invention will become more apparent when read the following detailed description by reference to the accompanying drawings illustrative of several preferred embodiments of the invention.

Referring now to the accompanying drawings, several preferred embodiments of the invention will be described hereinbelow.

Figures 1, 2, 3:
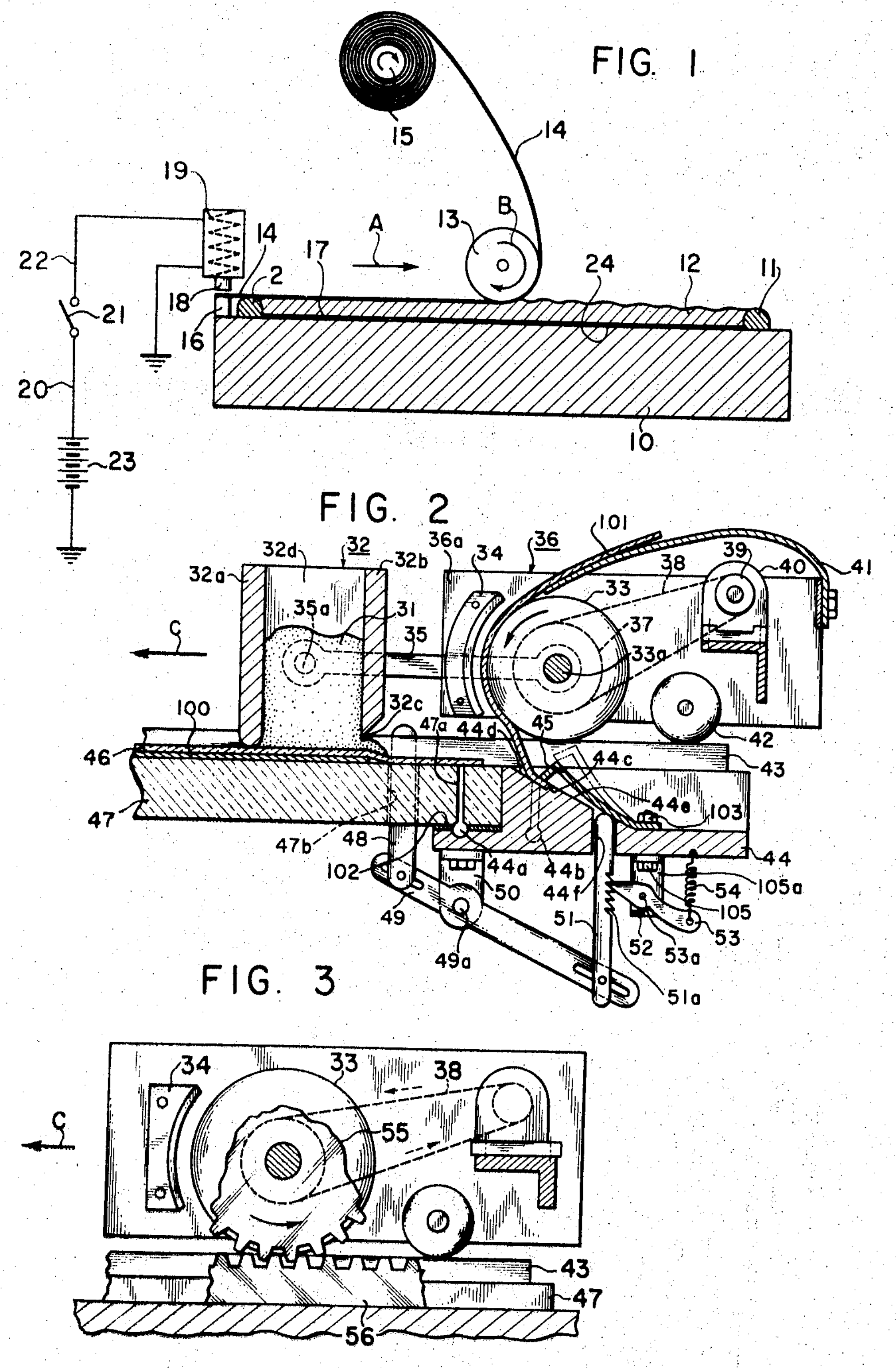
FIG. 1 is a schematic and substantially sectional representation of an apparatus as a first embodiment of the invention and adapted for carrying out the process according to the invention.
FIG. 2 is a sectional view of a second embodiment of the apparatus for carrying out the inventive process.
FIG. 3 is an elevational view of several working parts employed in the apparatus shown in FIG. 2.

In FIG. 1 a mode of the present invention is shown substantially in its section.

In this figure, the numeral 10 denotes a rigid and transparent base, preferably made of glass, on which a frame of rectangular configuration is mounted, although only two parallel sides thereof are shown in the drawing for simplicity.

Within the frame a mass of moldable photosensitive material is provisionally charged from an inclinable charging hopper, not shown.

Numeral 13 is a roller which is guided on another pair of guide and moldable mass damming members, not shown, of said frame, so as to be advanced from left to right in FIG. 1, as indicated by a small arrow "A" shown therein, although the drive motor and a power-transmitting means mechanically connected between the motor and roller 13 have been omitted for simplicity.

Numeral 14 denotes an anti-wrinkle sheet, preferably transparent, being supplied from a supply reel 15 which is rotatably mounted in suitable bearing means, not shown. The sheet 14 passes around the roller 13 for developing the sheet over the whole surface of the viscous mass 12 which may be preferably a viscous resin.

The sheet 14 is laid over the upper surface of the resin mass 12 through travel of the roller 13 on the guide frame 11 as it rolls in the direction as shown by the arrow "A". The rolling direction of roller 13 is clockwise as shown by a small arrow "B". It is most important to keep the anti-wrinkle sheet 14 in a non-tensioned state as it is being spread over the resin except for the initial spreading stage, as will be more fully described hereinbelow.

The viscous and photosensitive mass 12, preferably resin, as employable in the present invention should have preferably 500 – 500,000 c.p.s. measured at 25°C. As the mass, a conventional photosensitive resin or one of the improved resins serving for the desired purpose, as exemplified in the prior Japanese Patent Publication No. 19125/1968 may be used.

The material of the roller 13 may be metal, plastic, rubber or any other conventional material.

Under extreme conditions, a stationary roller may be used in place of the rotatable roller 13. But, in practice, a more speedy and efficient, film-overlaying job can be realized when the rotatable roller is used.

At the commencement of the film-spreading operation, the leading film end is taken out from the supply reel 15, guided below the roller 13 and placed on a support member 16 which is positioned in registration with an electromagnetic plunger 18 kept normally separate from the anvil member 16. Then, a manual or automatic switch 21 is closed, so as to convey current from a power source 23, lead 22, the now closed switch 21, lead 20 and solenoid 19 electrically connected one after another, said solenoid having the plunger or armature 18 for actuation thereof.

With the solenoid 19 thus energized, the plunger 18 moves downwards until it abuts against the anvil 16 through the intermediary of the initial of leading end of film sheet 14. At this stage, the roller 13 is placed on the left side member 2 and the drive motor, not shown, is energized by closing a further switch, not shown, so as to supply the motor with drive current from a current source. Although not specifically shown, the motor drive current circuit may be similar to the current shown schematically in FIG. 1. In this case, the motor is placed in place of the solenoid, and the motor is mechanically coupled, preferably through power transmission means, as was briefly hinted hereinbefore.

When the roller 13 has travelled a small distance, switch 21 is re-opened, so as to de-energize the solenoid 19. Then, the leading end of film sheet 14 is released from its caught state into its free state. By freeing the sheet, it can be spread out without forming substantially any wrinkle on the sheet.

As the material of the sheet 14, polyester, polyethylene, polypropylene, polyvinyl chloride, polyvinylidene chloride, polyvinyl acetate, cellophane or the like may well be utilized.

Before commencement of description of a second preferred embodiment of the invention, two numerical examples by use of the aforementioned first or basic embodiment will be set forth hereinbelow.

EXAMPLE 1

A composition, having a viscosity of 4,000 c.p.s. and comprising a liquid photosensitive resin (prepared from 100 wt. parts of polyester obtained from a polycondensation of fumaric acid and diethylene glycol; 30 wt. parts of acrylic acid and 0.5 wt. part of benzoin) was poured within a damming frame 11 (FIG. 1) having precise height of 3mm, the thickness of the poured mass amounting thus to 3mm. Anti-wrinkle sheet (shown at 14 in FIG. 1) of polyester, 0.1mm thick, was used. Although not shown in FIG. 1, a doctor edge such as shown at **32'*b* in FIG. 4 was adopted. The roller at 13 in FIG. 1 was of steel and had a diameter of 50 mm, having a polished glaze peripheral surface and moved horizontally as was referred to, while supplying the sheet 14**.

In this way, the doctored surface was covered by the sheet which was smoothly applied by the roller. A negative film 24 and a covering film 17 were placed on the glass base 10 in advance of the pouring of the liquid resin, the both films having jointly a thickness of 0.1 mm.

In FIG. 1, the negative film and covering film are illustrated as a single sheet.

In this way, a liquid resin layer having an even thickness of 2.9mm ± 2/100 mm including the sheet 14 was prepared. The entire assembly was then exposed to light from above and below. The wash-out process was also performed upon removal of the covering film and as conventionally and as was referred to hereinbefore. The formed printing relief, 0.5–1.0 mm high, was superior and durable for printing 5,000,000 sheets of news paper. As the liquid resin, any kind of materials which will be described hereinafter in connection with the second or third embodiment of the apparatus.

Next, referring to FIGS. 2 and 3, the second embodiment of the apparatus will be described.

The numeral 31 represents a mass of liquid photosensitive resin and contained in box-shaped container 32 opened at its bottom. This open box container 32 comprises a front wall **32*a*, a rear wall 32*b* and a pair of side walls of which only one is appearing on the drawing at 32*d*. As seen, the lower end of the front wall 32*a* positioned at a slightly lower level than that of the rear wall 32*b* and kept in contact with a covering film 46, thus forming a rear opening 32*c* for discharge of the resin in the rearward direction. The container vessel 32** is designed and arranged for performing a horizontal displacement, as will be more fully described hereinafter.

Numeral 47 represents a transparent base plate, made preferably of glass and fixedly mounted on a stationary machine frame, a part thereof only being shown at 44.

On the glass base 47, a negative film 100 for use in the printing technique and a cover film 46 are overlappingly mounted. The negative film has preferably prepared by the conventional photographic typesetting technique.

Reference numeral **44*a* represents a vacuum duct formed on the mounting part 44 and fluidically connected with a suction duct 47*a* which is connected with a proper vacuum source, such as vacuum reservoir, vacuum pump or the like. Although the vacuum duct 44*a* has been shown in singular; the number thereof may preferably increased to a certain plurality as the occasion may desire. Therefore, a suction force is applied onto the bottom surface of cover film 46, thus the shown end portion of the latter being always fixed onto the upper surface of the base plate 47. It is enough to arrange the related parts of the apparatus to attract tightly the initial end of the film 46 against the base 47, when seen in the direction of an arrow "C" in FIGS. 2 or 3.**

Resin container vessel 32 is pivotably mounted at **35*a* which corresponds to the fron pivot end of a connecting rod 35 having its rear end pivotably connected to roller shaft 33*a* provided for a metallic roller 33. This roller is adapted for rolling on the upper edges of a pair of spacer wall members 43 arranged in parallel in the longitudinal direction of the apparatus, corresponding to the left and right-hand direction in FIGS. 2 or 3.**

Pulley 37 is attached fixedly and concentrically with the roller 33 and mechanically connected through a belt 38 with a further pulley 39, the latter being driven from an electric motor 40 fitted with a reduction gearing, not shown.

As seen in FIG. 3, a pinion 55 is fixedly and concentrically attached to one end of roller 33, said pinion having a pitch circle which precisely corresponds to that of the outside peripheral surface of said roller 33. This pinion meshes with a stationary rack 56 arranged in parallel with the spacer members 43 of which only one is appearing in FIG. 2. By this arrangement, the roller 33 can roll on the upper surfaces of spacer walls 43 practically wihtout any slip.

Along the front part of the peripheral surface of roller 33 and separated at a small gap distance, 3mm at the maximum, there is provided an arc-shaped guide 34.

Numeral 101 denotes an anti-wrinkle sheet, playing an important role in the practice of the invention, is fed from a stationary storage magazine, not shown, to the narrow gap formed between guide 34 and roller 33. In place of the long sheet, a short-cut sheet can also be utilized. The anti-wrinkle sheet 101 is similar to that shown at 14 in FIG. 1.

For the convenience of this sheet feed, the inside surface of guide 34 has a concavely curved configuration made substantially parallel to the opposite part of the roller surface.

The part 44 mounts rigidly the initial or inner end part of a glass base plate 47 in position and formed with said vacuum duct 44*a*, as was hinted hereinbefore, a sealing packing 101 being positioned arround said duct and between the glass base 47 and the mounting part 44 of the machine frame. Although not shown, the base 47 is mounted at its opposite or outer end part on the similar mounting means, said end part situating at a substantial left-hand position in FIG. 2 so as to correspond to the overall width of the printing plate under preparation.

An inclined surface 44*d*–44*e* gradually increasing its height from right to left in FIG. 1 and preferably and concavely curved, is formed on the part 44, a projection 44*c* being formed thereon at an intermediate position between the end extremities of the inclined surface.

The fed-in base film 101 abuts finally against the projection 14*c* upon passage through the guide gap formed between the guide 34 and the roller 33, and provisionally stops.

A spring catch or latch 45 is fixedly mounted at its root end in close proximity to the lower end of the inclined surface on the mounting part 44, said catch being urged by its own elasticity towards engagement with the latch, the free end of the latter forming a hook adapted for catching the leading edge of the sheet 101 by the said engagement.

A bracket 50 is fixedly suspended from the bottom of the mounting part 50 and a lever 40 is pivotably supported at 49*a* by the lower end of said bracket. Glass base 47 is formed vertically with a guide opening 47*b* through which a slide bar 48 passes slidably. This slide bar is then at its upper end above the level of the upper surfaces of spacer members 43, while the lower end of the slide bar is pivotably connected with the lever 49 at its left-hand end through a pin-and-groove connection. In the similar way, a ratchet bar 51 is pivotably connected at its lower end with the lever 49 at its right-hand end in FIG. 2 through a pin-and-groove connection. The bar 51 passes slidably through the mounting part 44 and designed and arranged so that when it is pushed up from the position shown, the latch 45 is urged mechanically to shift from its engaging position shown in full line to its disengaged position shown in FIG. 2.

The bar 51 formed with ratchet teeth 51*a*, a pawl 53 being provided for engagement therewith.

A stationary support 105 is fixed to the bottom surface of the mounting part 44 which carries fixedly a stop for the pawl 53 which is pivotably mounted at 53*a* on said support.

A tension spring 54 is tensioned between the part 44 and the root end of pawl 53, thereby the latter being resiliently urged to turn about its pivot 53*a* in the counter clockwise direction in FIG. 2.

For disengagement of pawl 53 from ratchet teeth 51*a*, it suffices to pull the spring lightly downwards.

With the pawl thus disengaged, the catch 45 is brought into its operating position for gripping the leading edge portion of anti-wrinkle sheet 101.

Numeral 36 denotes generally a hollow carriage which is shown only by a side wall plate 36*a* for simplicity and carries a plurality of carrier roller 42 adapted for rolling on the spacer members 43 for moving in the direction shown by an arrow C and in the opposite direction. The carriage 36 carries an electric drive motor 40; pulleys 39 and 37; roller 33 and guide 34..

The gear-and-rack drive 55–56 is provided at each side of the roller 33 (FIG. 3).

The apparatus shown in FIG. 2 is shown at its such operational stage wherein the desired formation of a smoothly and evenly doctored layer of the photosensitive resin mass 31 is nearly initiated.

As referred to hereinbefore, the sheet 101 has been fed to the position readly for overlying on the doctored resin layer, the leading edge of the sheet being caught positively between the catch 45 and the projection 44*c*. The lower end of front wall 32 a of resin container 32 is kept in slidable contact with covering film 46 which tightly covers the printing negative 100.

When the drive motor 40 is started, motion is transmitted in succession through 39, 38 and 37 to roller 33. Since the roller shaft 33*a* is supported by the carriage 36 fitted with a cover plate 41, the carriage together with the roller 33 moving at a certain constant speed in the direction shown by the arrow C. In advance of this stage, the resin will be spread out on the cover film 46 gradually into a thin layer which has, however, a number of small air bubbles, ripples and the like unevenness, which would prevent the formation of the precisely smoothed resin surface and an even thickness of the resin layer adapted for the preparation of a printing plate.

With leftward shift or resin container 32, carriage 36 and roller 33, the lower end of rear wall 32*b* of the container will act as an effective doctor for the formation of the thin layer of the photosensitive resin having a predetermined thickness, and substantially at the same time, the anti-wrinkle sheet will be tightly laid down on the doctored resin surface.

After the leftward travel a short distance, the roller 33 rides upon slide bar 48 which is then pushed downwards so that the lever 49 is turned in counter clockwise direction, so as to push ratchet bar 51 upwards and to release the catch 45 from its operating position shown in full line to its free or non-operating position in chain dotted line, thereby the leading edge of the anti-wrinkle sheet 101 being freed from its caught position. Subsequently, the sheet is continuously applied tightly upon the doctored surface of the resin layer. In spite of this free application mode, the sheet will not be entrained by the travelling roll 33, because there is a strong adhering force between the sheet 101 and the now doctored resin layer. Therefore, it will be seen that when the roller 33 has reached at a position corresponding to the left-hand side extremity of the negative sheet, the doctored whole surface of the resin layer is fully covered by the sheet 101. It should be stressed at this stage that by the application of the anti-wrinkle sheet, the doctored liquid resin surface is protected very effectively from inviting undesirous and otherwise unavoidable formation of contraction irregularities appearing on the resin surface at a later actinic light exposure step for the formation of the printing plate. If the anti-wrinkle sheet 101 having normally a thickness of 100 microns is caught at its leading edge by the catch throughout the doctoring and sheet-covering process period, creases will be unavoidably created on the sheet, thus inviting disadvantageous unevenness of the doctored resin surface. Therefore, the fixation of the initial sheet edge by the catch 45 must be made during a starting period of the sheet application. Thus, it is a requisite requirement for the practice of the invention to apply the sheet 101 in its free state onto the doctored resin surface during the substantial part of the application period.

It should be noted that in the present embodiment, the container vessel acts as a doctor.

It is also possible to use a vacuum duct 44*b* so as to provide a vacuum suction force onto the leading edge of the sheet 101 in place of the mechanical catch 45.

Although not shown, a limit switch may be provided at the upper end of slide bar 48 and arranged electrically and mechanically to release the mechanical or vacuum-operated provisional catch for the initial sheet edge.

During the printing stage, the sheet 101 can act as the base sheet carrying thereon the printing relief, as will be more fully described hereinafter.

Figures 4, 5, 6:
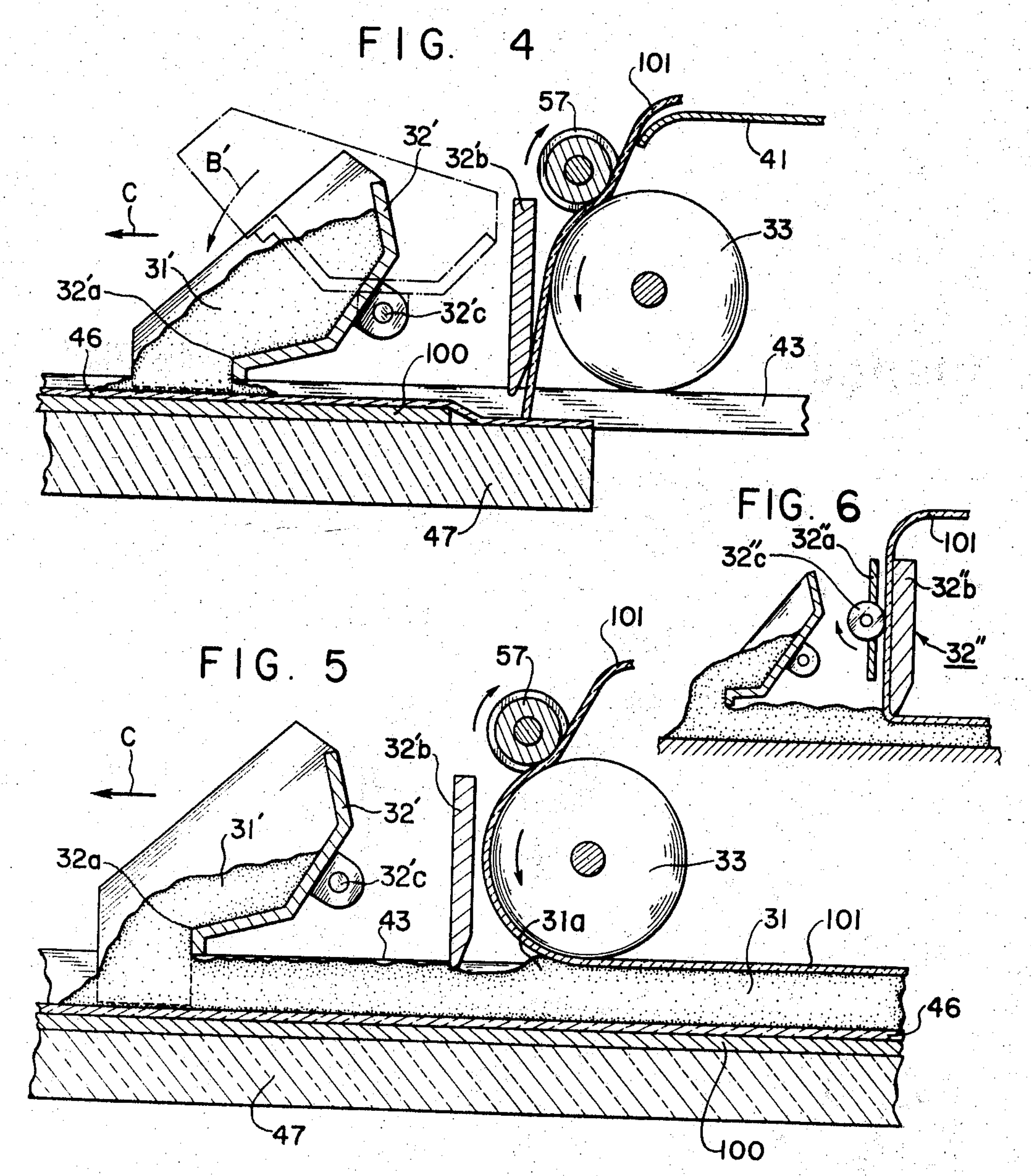
FIG. 4 is a substantially sectional view of main working parts of a third embodiment of the apparatus.
FIG. 5 is a similar view to FIG. 4 showing a different working stage of the apparatus from that shown in FIG. 4.
FIG. 6 is a schematic elevational view of several working parts of a modified device from that shown in FIGS. 4 and 5.

FIGS. 4 and 5 illustrate two different operational stages of the inventive apparatus as a second embodiment.

In this embodiment, the container vessel 32′ is pivotably mounted on an extension of the carriage which may be similar to that shown at 35 and 36 in FIG. 2. The contained resin 31′ is discharged from the container vessel 32′ by pivoting it from its normal or non-operating position shown in chain-dotted line to its operating position as shown in FIG. 4 by an arrow B′, for spreading out the resin mass 31′ in a preparatory layer upon the cover film 46. The numeral 47 denotes a glass base and 100 represents a printing negative, respectively as before.

The rear end portion 32′*a* acts as a preparatory doctor, as will be clearly seen from FIG. 4.

In the present embodiment, a main doctor 32′*b* is provided on the carriage and separated at a small advance distance, 2mm at the maximum, from the roller 33. The gap thus formed acts as a guiding passage for the anti-wrinkle sheet 101 when it is fed-in.

In the present embodiment, the guide 34 has been intentionally abolished. Thus, the main doctor 32′*b* acts as one side of the sheet guide means. There is provided no special catch for provisional fixing of the leading edge of the sheet 101.

When the sheet 101 is fed-in as before, the leading edge is finally brought into abutment with the upper surface of the covering film, as shown in FIG. 4. With further left-hand travel of the carriage, the sheet will fall down upon the doubledly doctored resin surface and covers it tightly as before, when the roller 33 has reached at the opposite side extremity of the printing negative 46. FIG. 5 shows an intermediate stage before completion of such sheet covering operation, wherein, however, the thickness of the doctored and smoothed resin layer 31 being substantially exergerated, in order to more clearly show a bulged-up ridge 31*a* or bank formed by the resin material along a movably contacting line between the bottom surface of the sheet 101 and the resin layer 31 situating directly before the rolling-contact line of the roller 33, indeed, by the close provision of the main doctor 32′*b* to the roller. This bulged-up resin 31*a* prevents effectively ambient air from being entrained by the rolling roller and the anti-wrinkle sheet betwwen the tightly contacting surfaces of the sheet 101 and the resin layer 31.

For attaining an effective feed-in operation for the anti-wrinkle sheet 101, a small guide roller 57 is mounted on the carrier, although the mounting means have been omitted for simplicity. The rotation of this small roller 57 is obtained by contact with the main roller 33.

In the modified device shown in FIG. 6, the doctor 32″*b* acts as a member of the feed-in means 32 by cooperation with a small feed roller 32″*c* through a carrier member 32″*a*. The pivotable resin container vessel is not provided with a reference number, because this vessel is of the same design and arrangement to those employed in the third embodiment.

The container vessel, the feel roller means 32″*a*, 32″*c* and the main doctor 32″*b* are all mounted on the travelling carrier which may be of the same design and arrangement shown in FIG. 2 at 36.

The anti-wrinkle sheet 101 is fed between the main doctor 32″*b* and feed roller 32″*c* and the lower doctor edge acts as the doctor per se as well as the sheet-application means.

The function and the effects to be attained by the present modification will be self-explanatory.

After the formation of the smooth and doctored resin layer and the application of the anti-wrinkle sheet, actinic light is projected from above in the order of 2,000 luxes for 5 – 10 seconds. By this preparatory exposure, the anchor layer is formed between the resin layer and the anti-wrinkle sheet which is utilized during the later printing step as the base sheet for carrying the printing relief, the latter being formed by projecting actinic light, preferably of again 2,000 luxes, from below for 3 – 10 minutes for the formation of latent and rigid relief within the mass of the resin layer and then washing out the non-exposed portions by the treatment with a solvent such as a weak aqueous alkaline solution after removal of the covering film which may normally amount to 10 microns in its thickness.

The thus finished printing plate is attached fixedly as conventionally onto a printing saddle or the like for performing the printing job. The preciseness of the thickness of the plate amounts generally to ± 0.03 mm which is allowable for newspaper printing.

As an example of the preparatory operation for printing tabloid newspapers and the main dimensional data of several main parts of the apparatus shown in FIGS. 4 and 5 were as follows:

| | | |
|---|---|---|
| Distance between main doctor and glass base | 0.9 | mm; |
| Thickness of spacer member stuck on the glass base | 0.6 | mm; |
| Width of spacer member | 0.6 | mm; |
| Thickness of anti-wrinkle sheet | 0.1 | mm; |
| Thickness of negative | 0.078 | mm; |
| Thickness of covering film | 9.012 | mm; |
| Diameter of roller 33 | 9.012 | mm. |
| Shift period of roller 33 for an effective stroke | 10 | sec., |
| Discharge period of resin from container vessel | 5 | sec., |
| Return stroke of roller 33 | 10 | sec., |
| Application of the negative | 15 | sec., |
| Application of covering film | 30 | sec., |
| Preparatory job for application of anti-wrinkle sheet | 30 | sec., |
| Laminating job for anti-wrinkle sheet, in total | 1 | min. |
| | 40 | sec., |
| Thickness of plate including anti-wrinkle sheet | 0.51 ± 9.025 | mm; |
| Size of printing newspaper | tabloid; | |

In comparison with the above, the conventional plate preparation step using photosensitive liquid resin relying upon the parallel plate method which necessitated a resin pouring period of seven minutes. The thickness of the plate amounted 1.0 ± 0.05mm. The size of the printing newspaper was 2 tabloid which means the regular size.

Additionally to say, the adoption of the anti-wrinkle or base sheet will considerably reduce the whole mass of the plate comprising high price photosensitive resin. In addition, according to the invention, the anchor layer between the relief per se and the base sheet consists of the employed photosensitive resin.

According to the conventional art, the base sheet was formed by a metal base, or the photosensitive resin per se, which resulted in an inefficient and prolonged plate-formation job in addition with the consumption of a larger amount of the costly photosensitive liquid resin.

The use of the tough base plate 101 results in a tough and strong printing plate.

Among known photosensitive liquid resins, a certain category thereof does not coagulate in the presence of air, especially oxygen contained therein, even upon exposure to actinic light. The anti-wrinkle sheet employed in the invention will act effectively as an insulator which interrupt the contact of air with the doctored resin surface.

The embodiments of the invention in which an exclusive property or privilege is claimed are as follows:

1. In a process for the preparation of a printing plate from a photosensitive liquid resin, the improvement comprising supplying a predetermined quantity of said liquid resin on a supporting surface and doctoring the surface of said liquid resin by passing the resin supply means over said surface with a predetermined clearance and pressing a plastic sheet into intimate unwrinkled contact with the doctored surface of the liquid resin by passing an applicator means over said surface with a pretermined spacing wherein the doctoring of the liquid resin and the pressing of the sheet onto the surface of the liquid resin are accomplished simultaneously by moving said means over said surface simultaneously.

* * * * *